(12) United States Patent
Huang

(10) Patent No.: US 6,274,471 B1
(45) Date of Patent: Aug. 14, 2001

(54) METHOD FOR MAKING HIGH-ASPECT-RATIO CONTACTS ON INTEGRATED CIRCUITS USING A BORDERLESS PRE-OPENED HARD-MASK TECHNIQUE

(75) Inventor: Jenn Ming Huang, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/325,953

(22) Filed: Jun. 4, 1999

(51) Int. Cl.$^7$ ................................................. H01L 21/44
(52) U.S. Cl. .................... 438/597; 438/672; 438/706; 438/710; 438/712; 438/239; 438/240; 438/253
(58) Field of Search .................... 438/597, 672, 438/706, 710, 712, 239, 240, 253

(56) References Cited

U.S. PATENT DOCUMENTS

| | | | |
|---|---|---|---|
| 4,966,870 | 10/1990 | Barbert et al. | 437/228 |
| 5,674,781 | 10/1997 | Huang et al. | 437/192 |
| 5,710,073 | * 1/1998 | Jeng et al. | 438/239 |
| 5,710,078 | 1/1998 | Tseng | 438/620 |
| 5,759,867 | 6/1998 | Armacost et al. | 437/195 |
| 5,792,703 | 8/1998 | Bronner et al. | 438/620 |
| 6,025,273 | * 2/2000 | Chen et al. | 438/706 |
| 6,037,216 | * 3/2000 | Liu et al. | 438/253 |
| 6,124,165 | * 5/1999 | Lien | 438/253 |

* cited by examiner

Primary Examiner—David Nelms
Assistant Examiner—Reneé R Berry
(74) Attorney, Agent, or Firm—George O. Saile; Stephen B. Ackerman

(57) ABSTRACT

A method for fabricating high-aspect-ratio contacts on integrated circuits, such as embedded DRAMs, using a borderless pre-opened hard-mask technique is achieved. After forming gate electrodes for field effect transistors (FETs) and local interconnections from a polycide layer having a silicon nitride ($Si_3N_4$) hard mask or cap layer, an anti-reflective coating is used to protect the FET source/drain areas. A photoresist mask and plasma etching are used to remove portions of the hard mask on the interconnections for contact openings, while the anti-reflective protects the source/drain areas. The photoresist mask and the anti-reflective coating are removed, and an interlevel dielectric (ILD) layer is deposited. The high-aspect-ratio contact openings can now be etched in the ILD layer to the source/drain areas, while concurrently etching reliable contact openings to the polycide interconnections where the cap $Si_3N_4$ has been removed without overetching the source/drain areas.

20 Claims, 3 Drawing Sheets

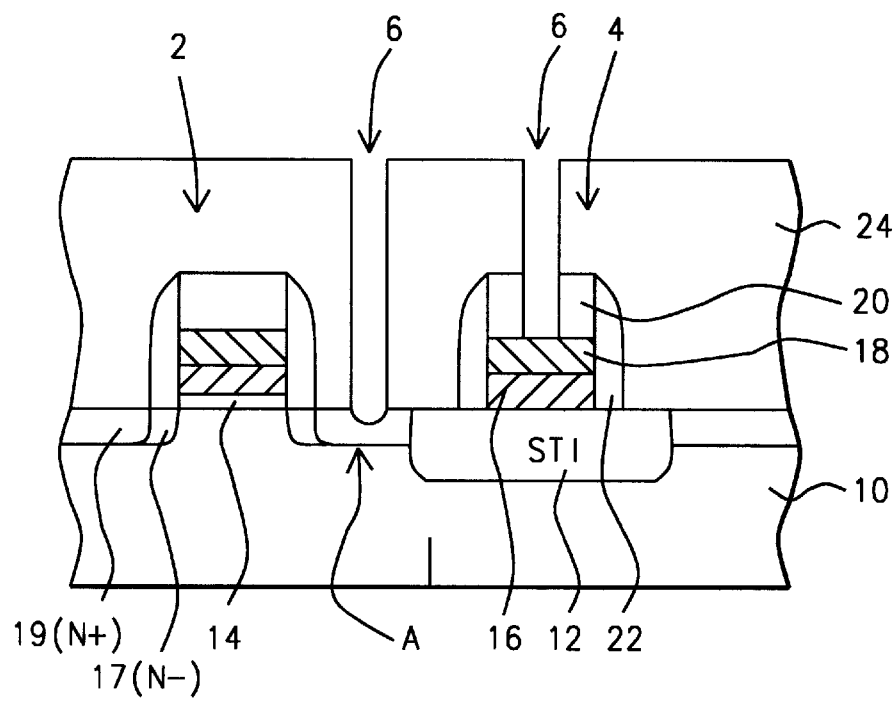
FIG. 1 – Prior Art
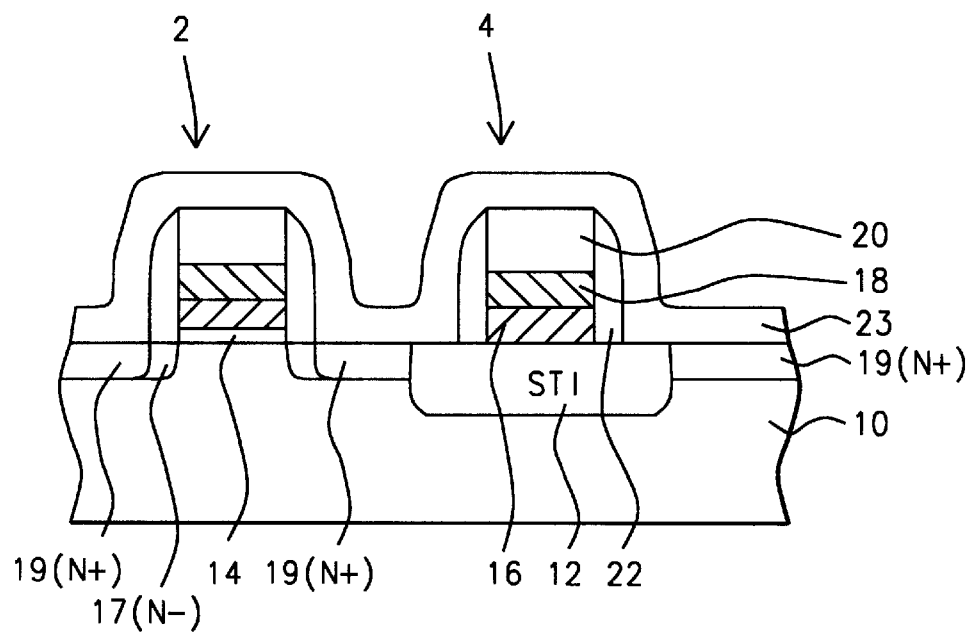
FIG. 2

METHOD FOR MAKING HIGH-ASPECT-RATIO CONTACTS ON INTEGRATED CIRCUITS USING A BORDERLESS PRE-OPENED HARD-MASK TECHNIQUE

BACKGROUND OF THE INVENTION

(1) Field of the Invention

This invention relates to semiconductor integrated circuit devices, and more specifically to a method for making high-aspect-ratio contact openings concurrently to a patterned polycide layer having a $Si_3N_4$ hard mask and to the shallow diffused regions on a semiconductor substrate without damaging the shallow diffused junctions on the substrate.

(2) Description of the Prior Art

The dramatic increase in circuit density on semiconductor substrates in recent years is the result of downscaling of the individual semiconductor devices, such as FETs, built in and on the semiconductor substrate. This downscaling has also resulted in a decrease in the pitch (linewidth+spacing) of patterned electrical conducting layers used as interconnections to wire up these devices. Typically the FET gate electrodes and local interconnections are made from a first polysilicon layer (or polycide layer), with a $Si_3N_4$ cap (hard mask) layer, that is patterned. A planar insulating layer, referred to as an interlevel-dielectric (ILD) layer, is then deposited to electrically insulate the FETs from the next level of interconnections. Unfortunately, as the minimum feature sizes decrease to submicrometer dimensions (e.g., less than 0.25 um) the contact openings that are etched in the ILD layer to the FET source/drain areas and are concurrently etched to the polycide interconnections are quite small and can have high aspect ratios (opening height/width) exceeding 9, which are difficult to etch. Another process problem also occurs when these semiconductor devices are scaled down. The junction depth of the FET source/drain diffused areas is also scaled down to minimize short-channel effects. For example, the junction depth is now typically less than 0.1 um, and therefore the source/drain areas are susceptible to over-etch damage when the contact openings are concurrently etched to the polycide local interconnections.

To better appreciate this problem, a schematic cross-sectional view of a portion of an integrated circuit is depicted by the drawing in FIG. 1 using a conventional process. Typically a silicon substrate 10 is used in which a field oxide 12 is formed to electrically isolate the device areas. After growing a thin gate oxide 14 on the device areas, a polycide layer is deposited made up of a conductively doped polysilicon layer 16 and a silicide layer 18. A silicon nitride ($Si_3N_4$) hard-mask layer 20 is deposited and layers 20, 18, and 16 are patterned to form the FET gate electrodes 2 over the device areas and concurrently to form the interconnections 4 over the field oxide 12. Typically for narrow channel FETs, to minimize short-channel effects, lightly doped drains 17($N^-$) are formed, for example by implanting, and then sidewall spacers 22 are formed by depositing a conformal $Si_3N_4$ layer and anisotropically etching back. The source/drain contact areas 19($N^+$) are formed using a second ion implantation to complete the FETs. The FETs are then electrically insulated from the next level of interconnections with an insulating layer 24, such as silicon oxide ($SiO_2$), that is planarized. Contact openings 6 are then etched in layer 24 to the source/drain areas 19($N^+$) and concurrently to the polycide lines 4 for the next level of electrical interconnections. Unfortunately, because of the closely spaced devices and relatively thick insulating layer 24, the openings 6 are small (about 0.20 um in width) and have high aspect ratios (HAR), which are difficult to reliably etch open. Further, because of hard mask 20 it is difficult to etch open the contacts to the silicide layer 18 without overetching and damaging the diffused junctions in area A in the device areas, as depicted in FIG. 1.

Several methods for making borderless contacts include U. S. Pat. No. 5,792,703 to Bronner et al. in which a first set of contacts is made self aligned and borderless to FET gate electrodes, and a second set of contacts is made with borders. Barber et al., U.S. Pat. No. 4,966,870, teach a method for making borderless contacts through a borophosphosilicate glass (BPSG) and an underlying $Si_3N_4$ layer using two different gas mixtures for plasma etching. Huang et al. in U.S. Pat. No. 5,674,781 describe a method for forming landing pads that also form concurrently local interconnections and borderless contacts for deep sub-half-micrometer integrated circuit applications. Another method is described in U.S. Pat. No. 5,759,867 to Armocost et al. in which disposable corner etch-stop spacers are used to form borderless contacts. In U.S. Pat. No. 5,710,078 to Tseng, a method is taught for making contacts to polycide structures with reduced contact resistance. However, none of the above references describes forming contacts concurrently to polycide structures and to shallow diffused areas on a substrate.

Therefore, there is still a strong need in the semiconductor industry for etching very small electrical contact openings that have closely spaced patterned polycide layers on ULSI circuits, and concurrently etching to a substrate without damaging the shallow diffused junction areas on the substrate.

SUMMARY OF THE INVENTION

Accordingly, it is a principal object of this invention to provide contact openings, having high aspect ratios, through an insulating layer to shallow diffused junctions in the source/drain areas in a silicon substrate and concurrently etching openings to a patterned polycide layer while preventing plasma-etch damage to the diffused junctions of the source/drain areas.

A further objective of this invention is to use a bottom anti-reflective coating (BARC) to protect the source/drain areas during removal of a hard mask over a patterned polycide layer prior to etching these high-aspect-ratio contact openings.

Still another object of this invention is to provide a method for more reliably and repeatable etching open the contact openings to the polycide without over-etching and damaging the shallow diffused junctions (source/drain areas) on the substrate.

Now in accordance with the objectives of this invention, a method is described for forming very small contact openings having high aspect ratios to a patterned polycide layer and concurrently etching contact openings to diffused areas such as source/drain areas on a substrate without overetching and damaging the diffused areas having shallow junctions. The method is particularly useful for high-density integrated circuits such as embedded DRAMs.

The method begins by providing a semiconductor substrate, such as a P-doped single crystal silicon substrate having device areas surrounded and isolated from each other by Field OXide (FOX) areas. A polycide layer composed of a conductively doped polysilicon and an upper refractory metal silicide layer is deposited. A hard-mask layer, such as $Si_3N_4$, is deposited on the polycide layer. The hard-mask layer and the polycide layer are patterned to form FET gate electrodes over the device areas, and the polycide layer is concurrently patterned to form local interconnections over the FOX areas. A first ion implantation is used to form lightly doped source/drain areas adjacent to the FET gate electrodes. A conformal $Si_3N_4$ layer is deposited and etched back to form sidewalls on the gate electrodes. A second ion implantation is then used to form source/drain contact areas. Next, by the method of this invention, an anti-reflective coating layer is deposited on the substrate, which is used to protect the source/drain areas from overetching at a later process step. The anti-reflective coating layer is preferably a polymer that is impervious to organic solvents and/or aqueous developers that are used in developing photoresist. For the purpose of this invention, the anti-reflective coating does not contain any photo-sensitive components that would be chemically removed during exposure and development of photoresist. A photoresist layer is coated on the anti-reflective layer. The photoresist layer is then exposed and developed to form openings over the polycide layer that is used to form the local interconnections. The anti-reflective coating exposed in the openings is etched to the hard-mask layer using plasma etching and an etchant gas containing fluorine (F) or hydrogen bromide (HBr). The $Si_3N_4$ hard mask in the openings is removed by plasma etching to the polycide layer, while the photoresist mask and anti-reflective coating, which serves as a protective polymer layer, protects the diffused source/drain areas from plasma etching in the device areas. The photoresist layer and the anti-reflective coating are now removed by stripping in a wet etch, such as in sulfuric acid ($H_2SO_4$) and an oxidant, such as hydrogen peroxide ($H_2O_2$) or ammonium persulfate. The photoresist and anti-reflective coating can also be removed by plasma ashing in oxygen. A relatively thick insulating layer is deposited over the FETs and interconnections to provide electrical insulation for the next level of interconnections. The insulating layer is a silicon oxide ($SiO_2$), and is planarized, for example by chemical/mechanical polishing (CMP). Alternatively, the insulating layer can be a thin silicon oxynitride (SiON) or $Si_3N_4$ layer and a thick BPSG layer. The SiON layer serves as a diffusion barrier to prevent unintentional doping of the substrate by the BPSG layer. High-aspect-ratio contact openings can now be etched in the relatively thick insulating layer to the patterned polycide interconnect layer while concurrently etching contact openings to the substrate without overetching and degrading the shallow diffused source/drain areas.

BRIEF DESCRIPTION OF THE DRAWINGS

The objects and advantages of this invention are best understood by the following embodiment and with reference to the attached drawings which are now briefly described.

FIG. 1 is a schematic cross-sectional view of a partially completed integrated circuit by the prior art depicting damage to a source/drain contact area on a substrate when etching contact openings in an insulating layer and a hard-mask layer to a polycide interconnect.

FIGS. 2 through 6 are schematic cross-sectional views of a partially completed integrated circuit showing the sequence of processing steps for forming high-aspect-ratio contact openings in an insulating layer to a patterned polycide layer and to the source/drain areas without damaging the source/drain areas.

DESCRIPTION OF THE PREFERRED EMBODIMENTS

Figure 3:
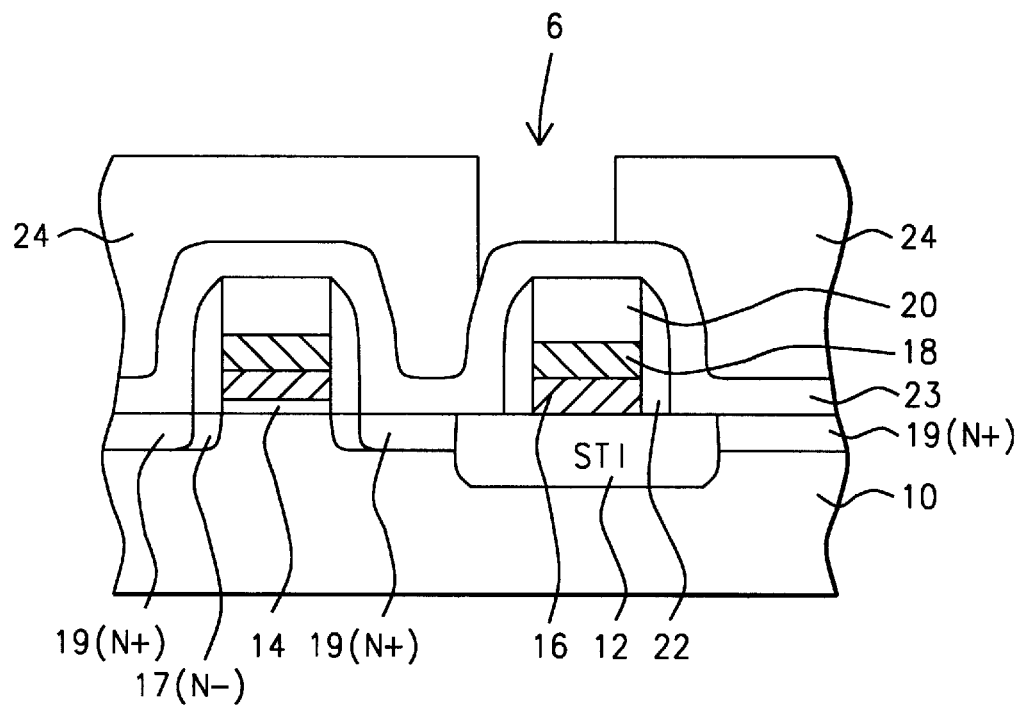

Now in keeping with the objects of this invention, the detailed method is described for making small contact openings with high-aspect-ratios (HAR) and without damage to the shallow diffused areas on the substrate.

Although the method is described for N-channel FETs on a P doped substrate, it should be understood by one skilled in the art that the method of this invention can be applied, in general, for making these HAR contact openings on integrated circuits having both N-channel and P-channel FETs by including additional process steps. For example, by including P and N doped wells in and on the substrate both N and P channel FETs can be formed from which CMOS circuits can be made. Also, the method is particularly useful for embedded DRAM circuits in which a multitude of HAR contact openings are etched to the substrate and to a patterned polycide layer.

Referring to FIG. 2, the method for making these high-aspect-ratio (HAR) damage-free contact openings begins by providing a substrate 10. The substrate 10 is preferably composed of a P-type single-crystal silicon having a <100> crystallographic orientation. A relatively thick field oxide 12 is formed around the active device regions to isolate the individual devices. The field oxide 12 is typically formed using the LOCal Oxidation of Silicon (LOCOS) method, but for future higher density circuits various Shallow Trench Isolation (STI) methods are preferred. Briefly, one method of forming the STI 12 is by recessing the substrate 10 in the field oxide regions, growing a thin thermal oxide to reduce surface damage and filling the recesses with a chemical-vapor-deposited silicon oxide. The $SiO_2$ is then etched or polished back to form a planar surface with the substrate 10 as shown in FIG. 2. Typically the STI 12 is between about 3000 and 5000 Angstroms. A thin gate oxide 14 is then formed on the active device areas by thermal oxidation. The preferred thickness of the gate oxide is between about 20 and 100 Angstroms.

Still referring to FIG. 2, a polycide layer, having a hard-mask or cap layer, is deposited and patterned to form FET gate electrodes 2 over the device areas, and to form local interconnections 4 over the STI 12. The polycide layer is formed by depositing a conductively doped poly-silicon layer 16 and an upper refractory metal silicide layer 18. The polysilicon layer 16 is deposited by low-pressure chemical vapor deposition (LPCVD) using silane ($SiH_4$) as the reactant gas, and is doped either in situ during deposition or by ion implantation. For N-channel FETs described here, polysilicon layer 16 is doped with arsenic or phosphorus to a concentration of between about $1.0\ E\ 19$ and $1.0\ E\ 21$ atoms/$cm^3$, and the polysilicon is deposited to a thickness of between about 500 and 2000 Angstroms. The silicide layer 18 is preferably a tungsten silicide ($WSi_x$) deposited by CVD using tungsten hexafluoride ($WF_6$) as the reactant gas. The $WSi_x$ layer 18 is deposited to a thickness of between about 500 and 2000 Angstroms. Next, a hard-mask or cap layer 20 is deposited on the $WSi_x$ layer 18. Layer 20 is preferably $Si_3N_4$, deposited by LPCVD using a reactant gas such as dichlorosilane ($SiCl_2H_2$) and ammonia ($NH_3$), and is deposited to a preferred thickness of between about 500 and 2000 Angstroms.

Continuing with FIG. 2, conventional photolitho-graphic techniques and anisotropic plasma etching are used to pattern the $Si_3N_4$ hard-mask layer 20 and the polycide layer (16 and 18) to form FET gate electrodes 2 over the device areas and to form the local interconnections 4 over the STI areas 12. A first ion implantation is used to form lightly doped source/drain areas 17($N^-$) adjacent to the FET gate electrodes 2 to minimize short-channel effects. Then, a conformal $Si_3N_4$ layer 22 is deposited and etched back to form sidewall spacers, also labeled 22, on the sidewalls of the gate electrodes 2. The $Si_3N_4$ layer 22 is etched back using anisotropic plasma etching to form sidewall spacers having a width of between about 500 and 1500 Angstroms. A second ion implantation is then used to form source/drain contact areas 19($N^+$) to complete the FETs. Typically, for high-density circuits, the resultant junction depth $x_j$ of the source/drain contact areas 19($N^+$) is relatively shallow, that is, $x_j$ is less than 0.1 micrometer (um).

Referring still to FIG. 2, a key feature of this invention is the deposition of an anti-reflective coating (ARC) layer 23, which is used, in part, to protect the source/drain areas 19($N^+$) when a portion of the hard mask 20 over the polycide interconnect 4 is removed. The anti-reflective coating layer 23 is preferably a polymer that is impervious to organic solvents and/or aqueous developers that are used in developing photoresist. The polymer is preferably a primary polyimide dissolved in a solvent such as cyclohexanone. The polyimide is then spin coated and baked at about 160 to 220° C. for about 60 to 100 seconds to form a rigid polymer film. Preferably polymer layer 23 is deposited to a thickness of between about 1000 and 3000 Angstroms. Since the polymer film is used as a protective layer, and not as an anti-reflective coating, it is not necessary to include a photosensitive chemical component that would chemically react when exposed to light. Some polymers commercially available include BARLi, manufactured by Hoechst of Germany, XHRi-11, manufactured by Brower Science of USA, and SWK365D, manufactured by TOK of Japan.

Referring now to FIG. 3, a photoresist layer 24 is coated on the anti-reflective layer 23, and the photoresist is exposed and developed to form openings 6 over the patterned polycide layer (layers 18 and 16) that is used to form the local interconnections 4, while leaving essentially undeveloped the protective polymer layer 23.

Figure 4:
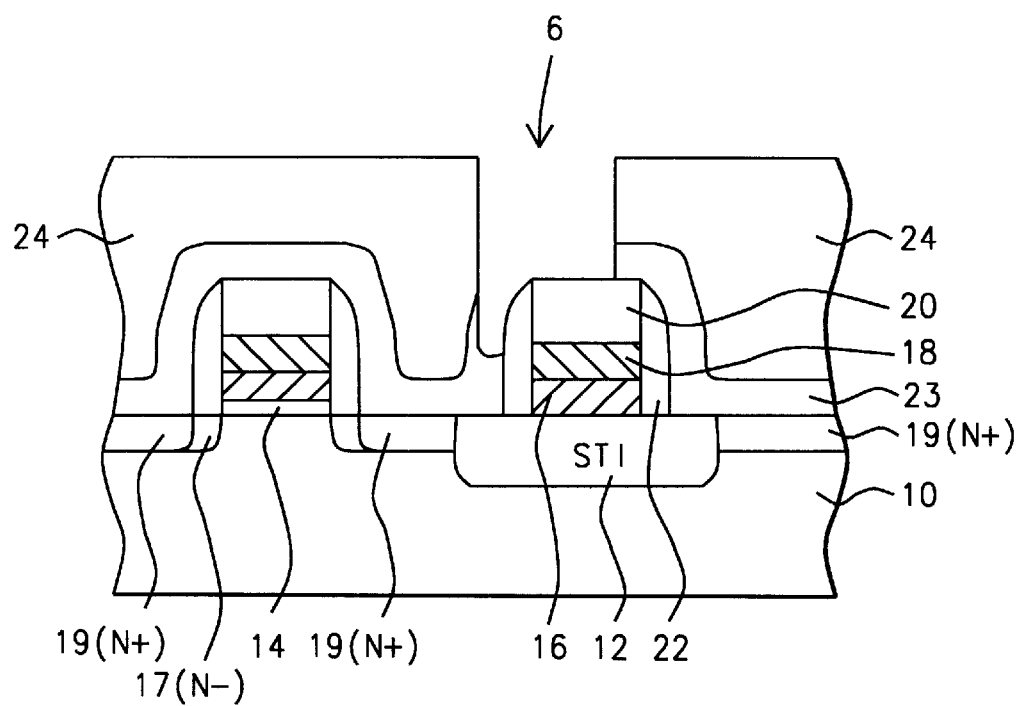

Referring to FIG. 4, the anti-reflective coating (protective polymer layer) 23 exposed in the openings 6 is etched to the silicon nitride hard-mask layer 20. This exposes the hard mask 20, while the anti-reflective coating 23 protects the source/drain areas 19 in the region B at the interface with the shallow trench 12. The anti-reflective coating 23 is etched preferably by plasma etching in a reactive ion etcher using an etchant gas mixture such as oxygen ($O_2$) and nitrogen ($N_2$).

Still referring to FIG. 4, the $Si_3N_4$ hard mask 20 in the openings 6 is removed by anisotropic plasma etching to the silicide layer 18, while the photoresist mask 24 and protective polymer 23 protect the diffused source/drain areas 19 from the plasma etching. The etching of the $Si_3N_4$ layer 20 is preferably carried out by reactive ion etching using an etchant gas such as sulfur hexafluoride ($SF_6$).

Figure 5:
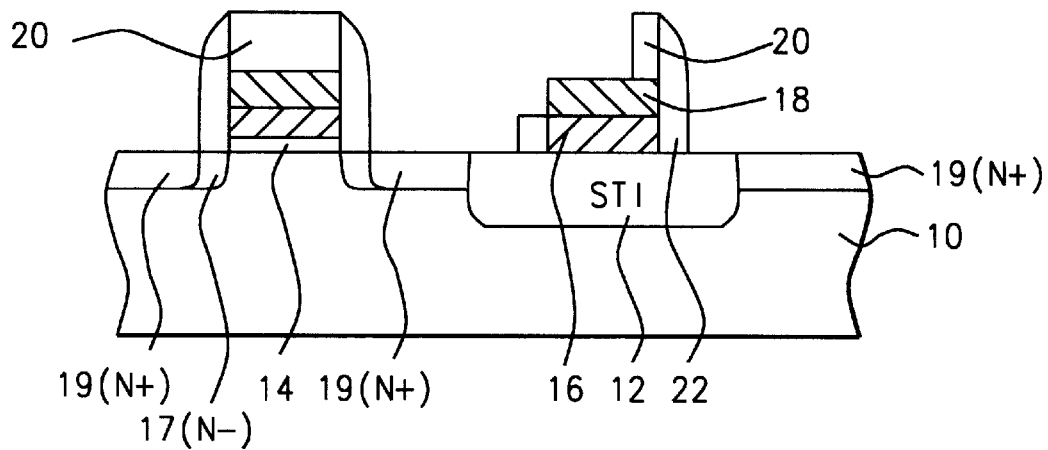

Referring to FIG. 5, the photoresist layer 24 and the anti-reflective coating (ARC) that serves as a protective polymer layer 23 are now removed by stripping in a wet etch, such as in sulfuric acid ($H_2SO_4$) and an oxidant, such as hydrogen peroxide ($H_2O_2$) or ammonium persulfate. Alternatively, the photoresist layer 24 and anti-reflective coating 23 can be removed by plasma ashing in oxygen.

Figure 6:
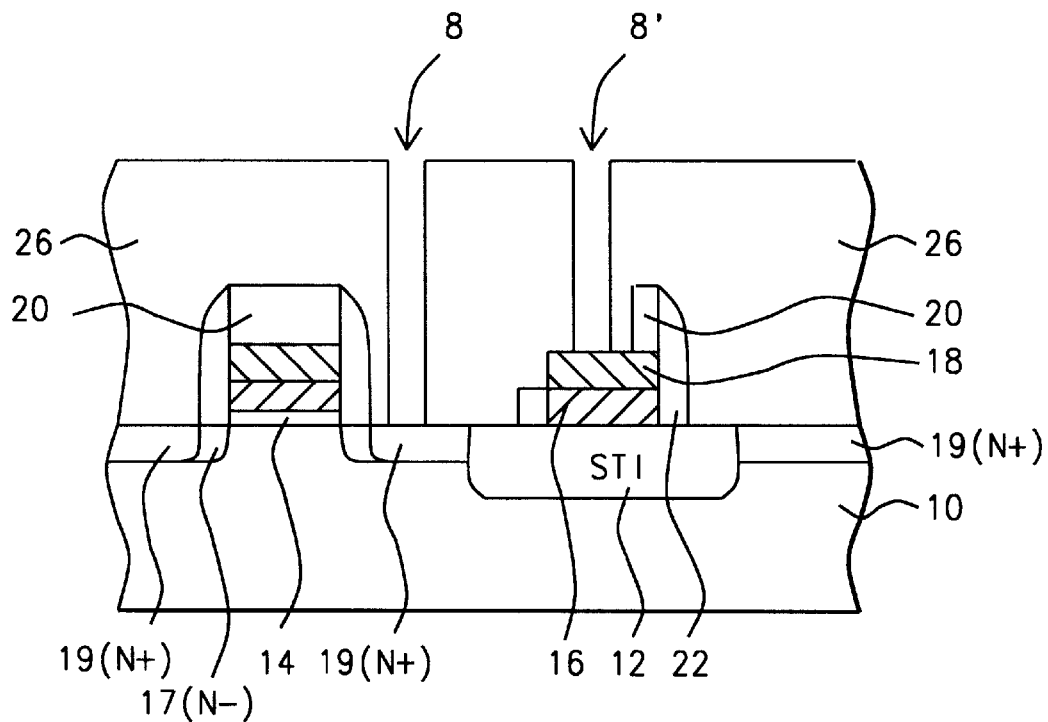

Referring to FIG. 6, a relatively thick insulating layer 26, commonly referred to as an interlevel-dielectric (ILD) layer, is deposited over the FETs and interconnections to provide electrical insulation for the next level of interconnections. The ILD layer 26 is preferably silicon oxide ($SiO_2$) deposited by LPCVD using, for example tetraethosiloxane (TEOS) as the reactant gas. Layer 26 is deposited to a preferred thickness of between about 10000 and 30000 Angstroms. Alternatively, the ILD layer 26 can be a doped $SiO_2$ layer, such as BPSG. When a BPSG layer is used, a thin silicon oxynitride (SiON) or $Si_3N_4$ or undoped $SiO_2$ layer is deposited first as a barrier layer to prevent unintentional doping of the substrate by the BPSG layer. The ILD layer 26 is then planarized, for example by chemical/mechanical polishing (CMP).

Continuing with FIG. 6, high-aspect-ratio contact openings 8 are now etched in the relatively thick insulating layer 26 to the source/drain areas 19, while concurrently contact openings 8' are etched to the polycide interconnect lines (18 and 16). Since the hard-mask layer 20 is removed over the patterned polycide interconnect layer (18 and 16), the contact openings 8 to the source/drain areas 19 can be etched without overetching and degrading the shallow diffused areas 19, while the contact openings 8' are concurrently etched to the polycide interconnect layer (18 and 16). The removal of the $Si_3N_4$ hard-mask layer 20 allows the contact openings 8' to be completed without overetching in the contact openings 8.

While the invention has been particularly shown and described with reference to the preferred embodiment thereof, it will be understood by those skilled in the art that various changes in form and details may be made without departing from the spirit and scope of the invention.

What is claimed is:

1. A method for making high-aspect-ratio contact openings in an insulating layer on a semiconductor substrate for integrated circuits comprising the steps of:

providing said semiconductor substrate having device areas surrounded by field oxide areas;

depositing a polycide layer and a hard-mask layer on said substrate;

patterning said hard-mask layer and said polycide layer to form portions of devices over said device areas and interconnections over said field oxide areas, said devices having diffused areas in said device areas of said substrate;

depositing an anti-reflective coating layer on said substrate;

coating a photoresist layer on said substrate and patterning to form openings over said interconnections;

etching said anti-reflective coating exposed in said openings to said hard mask;

etching said hard-mask layer in said openings to said polycide layer that forms said interconnections while said anti-reflective coating protects said diffused areas;

removing said photoresist layer and said anti-reflective coating;

depositing an insulating layer on said substrate;

etching contact openings in said insulating layer to said diffused areas and concurrently etching openings to said polycide layer that forms said inter-connections.

2. The method of claim 1, wherein said polycide layer is composed of a conductively doped polysilicon layer having a thickness of between about 500 and 2000 Angstroms and an upper tungsten silicide layer having a thickness of between about 500 and 2000 Angstroms.

3. The method of claim 1, wherein said hard-mask layer is silicon nitride and has a thickness of between about 500 and 2000 Angstroms.

4. The method of claim 1, wherein said anti-reflective coating is a polymer that is impervious to organic solvents and aqueous developers used to develop photoresist.

5. The method of claim 1, wherein said anti-reflective coating is plasma etched using hydrogen bromide as the etchant gas.

6. The method of claim 1, wherein said anti-reflective coating is plasma etched in a fluorine-containing gas.

7. The method of claim 1, wherein said photoresist and said anti-reflective coating are removed using sulfuric acid and hydrogen peroxide as an oxidant.

8. The method of claim 1, wherein said insulating layer is silicon oxide and is planarized to a thickness of between about 10000 and 30000 Angstroms over said patterned polycide layer.

9. The method of claim 1, wherein said insulating layer is a silicon oxynitride layer having a thickness of between about 200 and 400 Angstroms and an upper borophosphosilicate glass that is planarized to a thickness of between about 10000 and 30000 Angstroms over said patterned polycide layer.

10. The method of claim 1, wherein said contact openings are etched in a high-density plasma etcher using a fluorine-based gas as the etchant gas.

11. A method for making high-aspect-ratio contact openings in an insulating layer on a semiconductor substrate for integrated circuits comprising the steps of:

providing said semiconductor substrate having device areas surrounded by field oxide areas;

depositing a polycide layer and a hard-mask layer on said substrate;

patterning said hard-mask layer and said polycide layer to form gate electrodes for field effect transistors (FETs) over said device areas and interconnections over said field oxide areas, said FETs having diffused source/drain areas in said device areas of said substrate;

depositing an anti-reflective coating layer on said substrate;

coating a photoresist layer on said substrate and patterning to form openings over said interconnections;

etching said anti-reflective coating exposed in said openings to said hard mask;

etching said hard-mask layer in said openings to said polycide layer that forms said interconnections while said anti-reflective coating protects said diffused source/drain areas in said device areas;

removing said photoresist layer and said anti-reflective coating;

depositing an insulating layer on said substrate;

etching contact openings in said insulating layer to said diffused source/drain areas and concurrently etching openings to said polycide layer that forms said interconnections.

12. The method of claim 11, wherein said polycide layer is composed of a conductively doped polysilicon layer having a thickness of between about 500 and 2000 Angstroms and an upper tungsten silicide layer having a thickness of between about 500 and 2000 Angstroms.

13. The method of claim 11, wherein said hard mask layer is silicon nitride and has a thickness of between about 500 and 2000 Angstroms.

14. The method of claim 11, wherein said anti-reflective coating is a polymer that is impervious to organic solvents and aqueous developers used to develop photoresist.

15. The method of claim 11, wherein said anti-reflective coating is plasma etched using hydrogen bromide as the etchant gas.

16. The method of claim 11, wherein said anti-reflective coating is plasma etched in a fluorine-containing gas.

17. The method of claim 11, wherein said photoresist and said anti-reflective coating are removed using sulfuric acid and hydrogen peroxide as an oxidant.

18. The method of claim 11, wherein said insulating layer is silicon oxide and is planarized to a thickness of between about 10000 and 30000 Angstroms over said patterned polycide layer.

19. The method of claim 11, wherein said insulating layer is a silicon oxynitride layer having a thickness of between about 200 and 400 Angstroms and an upper borophosphosilicate glass that is planarized to a thickness of between about 10000 and 30000 Angstroms over said patterned polycide layer.

20. The method of claim 11, wherein said contact openings are etched in a high-density plasma etcher using a fluorine-based gas as the etchant gas.

* * * * *